US011121054B2

(12) United States Patent
Yamamoto et al.

(10) Patent No.: US 11,121,054 B2
(45) Date of Patent: Sep. 14, 2021

(54) MODULE

(71) Applicant: Murata Manufacturing Co., Ltd., Kyoto (JP)

(72) Inventors: Issei Yamamoto, Kyoto (JP); Tadashi Nomura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 41 days.

(21) Appl. No.: 16/508,788

(22) Filed: Jul. 11, 2019

(65) Prior Publication Data
US 2019/0341329 A1 Nov. 7, 2019

Related U.S. Application Data

(63) Continuation of application No. PCT/JP2018/001299, filed on Jan. 18, 2018.

(30) Foreign Application Priority Data

Jan. 18, 2017 (JP) .............................. JP2017-006323

(51) Int. Cl.
*H01L 23/367* (2006.01)
*H01L 23/31* (2006.01)
(Continued)

(52) U.S. Cl.
CPC ...... *H01L 23/3675* (2013.01); *H01L 23/3128* (2013.01); *H01L 23/49838* (2013.01);
(Continued)

(58) Field of Classification Search
CPC . H01L 25/16; H01L 23/49838; H01L 23/367; H01L 23/3675; H01L 25/165;
(Continued)

(56) References Cited

U.S. PATENT DOCUMENTS 6,294,731 B1 * 9/2001 Lu ........................ H01L 23/433
174/388
9,691,710 B1 * 6/2017 Deng ...................... H01L 25/16
(Continued)

FOREIGN PATENT DOCUMENTS

JP    H07-273250 A    10/1995
JP    H08-153835 A    6/1996
(Continued)

OTHER PUBLICATIONS

International Search Report for International Application No. PCT/JP2018/001299, dated Mar. 20, 2018.
(Continued)

*Primary Examiner* — Mouloucoulaye Inoussa
(74) *Attorney, Agent, or Firm* — Pearne & Gordon LLP

(57) ABSTRACT

A module improves a heat-releasing effect and that can be stably mounted on a mother substrate or the like. The module includes: a first component mounted on one main surface of a wiring substrate and generates heat; second components mounted on the one main surface of the wiring substrate; a sealing resin layer that seals the first component and the second components so as not to cover a top surface of the first component; and heat-dissipating parts arranged on the top surface of the first component. The height of the highest positions of the heat-dissipating parts relative to the one main surface is less than or equal to the position of a highest surface out of a surface of the sealing resin layer that is on the opposite side from the surface of the sealing resin layer that faces the one main surface.

11 Claims, 8 Drawing Sheets

(51) Int. Cl.
*H01L 23/498* (2006.01)
*H01L 23/552* (2006.01)
*H01L 25/16* (2006.01)
*H01L 21/48* (2006.01)
*H01L 21/56* (2006.01)
*H01L 23/29* (2006.01)

(52) U.S. Cl.
CPC .......... *H01L 23/552* (2013.01); *H01L 25/165* (2013.01); *H01L 21/486* (2013.01); *H01L 21/4853* (2013.01); *H01L 21/4857* (2013.01); *H01L 21/4864* (2013.01); *H01L 21/4867* (2013.01); *H01L 21/4871* (2013.01); *H01L 21/565* (2013.01); *H01L 23/295* (2013.01)

(58) Field of Classification Search
CPC ............. H01L 23/3677; H01L 21/4857; H01L 21/486; H01L 21/565; H01L 21/4871; H01L 21/4864; H01L 23/295; H01L 21/4867; H01L 23/5384; H01L 25/0655; H01L 23/3142; H01L 23/5385; H01L 23/5386; H01L 23/552; H01L 23/66; H01L 23/3128; H01L 24/97; H01L 23/5383; H05K 3/28; H05K 9/00; H05K 7/20; H05K 1/02; H01Q 1/2283; H01Q 1/44; H01Q 1/40; G06K 19/07749
USPC ........... 257/88, 676, 692, E21.001, E23.031, 257/E21.499, E33.066; 438/106, 119, 438/127; 361/764, 679.02, 728
See application file for complete search history.

(56) References Cited

U.S. PATENT DOCUMENTS

| | | | |
|---|---|---|---|
| 2003/0011053 | A1 | 1/2003 | Yasunaga |
| 2004/0212056 | A1* | 10/2004 | Chen .................... H01L 23/3128 257/678 |
| 2009/0091904 | A1* | 4/2009 | Hatanaka ............. H03H 9/1021 361/764 |
| 2012/0187551 | A1* | 7/2012 | Kushino ................. H01L 25/16 257/659 |
| 2017/0162524 | A1* | 6/2017 | Wang ................... H01L 23/3128 |
| 2017/0278804 | A1 | 9/2017 | Kawabata et al. |
| 2018/0033738 | A1* | 2/2018 | Kawabata ............... H01L 24/16 |
| 2020/0286839 | A1* | 9/2020 | Jang ...................... H01L 23/367 |

FOREIGN PATENT DOCUMENTS

| | | |
|---|---|---|
| JP | H08-186200 A | 7/1996 |
| JP | 2003-031744 A | 1/2003 |
| JP | 2004-327556 A | 11/2004 |
| JP | 2015-230913 A | 12/2015 |
| JP | 5988003 B1 | 9/2016 |

OTHER PUBLICATIONS

Written Opinion for International Application No. PCT/JP2018/001299, dated Mar. 20, 2018.

\* cited by examiner

MODULE

This is a continuation of International Application No. PCT/JP2018/001299 filed on Jan. 18, 2018 which claims priority from Japanese Patent Application No. 2017-006323 filed on Jan. 18, 2017. The contents of these applications are incorporated herein by reference in their entireties.

BACKGROUND

Technical Field

The present disclosure relates to a module that includes a heat-generating component that is mounted on a wiring substrate and includes a structure that is for dissipating generated heat.

In a module in which a heat-generating component is mounted on a wiring substrate, a heat dissipation countermeasure may be adopted in order to prevent components from becoming damaged as a result of being heated. A semiconductor device 100 disclosed in Patent Document 1 and illustrated in FIG. 11A is an example of such a module in which a heat dissipation countermeasure has been adopted.

The semiconductor device 100 includes: a multilayer wiring substrate 101, conductive leads 102; a semiconductor element 103 that is held on a semiconductor element mounting surface 101a of the multilayer wiring substrate 101 by the conductive leads 102 and has a circuit formation surface 103a and an opposite circuit formation surface 103b; and resin 104 that is provided so as to cover the conductive leads 102 and the semiconductor element 103 except for the opposite circuit formation surface 103b of the semiconductor element 103. As illustrated in FIG. 11A, the semiconductor device 100 has a structure in which the opposite circuit formation surface 103b of the semiconductor element 103 is exposed from the resin 104 and is configured such that air that is for cooling the semiconductor device directly contacts the semiconductor element 103. Thus, an improvement in a heat-dissipating effect of the semiconductor device 100 is achieved. However, for example, when a large number of bands are used in communication, the amount of heat generated by the semiconductor element 103 is large and the cooling performance realized for the semiconductor device 100 simply by the opposite circuit formation surface 103b of the semiconductor element 103 being exposed from the resin 104 is not sufficient.

Patent Document 1 also discloses a semiconductor device 120 as illustrated in FIG. 11B. As illustrated in FIG. 11B, in the semiconductor device 120, heat-dissipating fins 121 are bonded to the opposite circuit formation surface 103b of the semiconductor element 103. The surface area that is in direct contact with the air is increased by the fins 121 and the heat-dissipating effect is thus further improved.

Patent Document 1: Japanese Unexamined Patent Application Publication No. 7-273250 (refer to paragraphs 0031-0032 and FIGS. 5 and 6)

BRIEF SUMMARY

However, the heat-dissipating fins 121 protrude from the resin 104 in the above-described semiconductor device 120. In this structure, the fins 121 interfere with a suction pad that is used when mounting the semiconductor device 120 on a mother substrate or the like, and consequently it is difficult to stably mount the semiconductor device 120 on a mother substrate or the like.

The present disclosure provides a module that can improve a heat-dissipating effect and can be stably mounted on a mother substrate or the like.

A module of the present disclosure includes: a wiring substrate; a first component that is mounted on one main surface of the wiring substrate and generates heat; a second component that is mounted on the one main surface; a sealing resin layer that seals the first component and the second component without necessarily covering at least part of an opposite surface of the first component that is opposite from a surface of the first component mounted on the one main surface of the wiring substrate; and a heat-dissipating part that is arranged on the at least part of the opposite surface of the first component. A height of a highest position of the heat-dissipating part relative to the one main surface is less than or equal to a height of a position of a highest surface out of a surface of the sealing resin layer when viewed in a direction perpendicular to the one main surface of the wiring substrate.

With this configuration, the surface area of a part that contributes to dissipation of heat is increased by the heat-dissipating part arranged on a part of the opposite surface of the first component that is not covered by the sealing resin layer, and therefore the heat-dissipating effect is improved. Furthermore, since the heat-dissipating part does not protrude beyond the highest surface of the sealing resin layer as a result of the height of the highest position of the heat-dissipating part being made less than or equal to the height of the position of the highest surface out of the surface of the sealing resin layer, the module can be stably mounted on a mother substrate or the like without necessarily the heat-dissipating part interfering with a suction pad and a reduction in the profile of the module can be realized.

In addition, the material of the heat-dissipating part may be a metal. With this configuration, heat emitted by the first component is rapidly transmitted to the entirety of the heat-dissipating part, and therefore the heat-dissipating effect is further improved.

Furthermore, the module may further include: a shield layer that covers the surface of the sealing resin layer, a part of the at least part of the opposite surface of the first component on which the heat-dissipating part is not arranged, a surface of the heat-dissipating part, and a side surface of the wiring substrate. With this configuration, the surface area of the part that contributes to dissipation of heat is further increased by the shield layer, and therefore the heat-dissipating effect is further improved.

In addition, the heat-dissipating part may have a columnar or plate-shaped structure. With this configuration, a specific example of the structure of the heat-dissipating part can be provided.

According to the present disclosure, the surface area of the part that contributes to dissipation of heat is increased by the heat-dissipating part arranged on a part of the opposite surface of the first component that is not covered by the sealing resin layer, and therefore the heat-dissipating effect is improved. Furthermore, since the heat-dissipating part does not protrude beyond the highest surface of the sealing resin layer as a result of the height of the highest position of the heat-dissipating part being made less than or equal to the height of the position of the highest surface out of the surface of the sealing resin layer, the module can be stably mounted on a mother substrate or the like without necessarily the heat-dissipating part interfering with a suction pad and a reduction in the profile of the module can be realized.

DETAILED DESCRIPTION

First Embodiment

Figure 1:
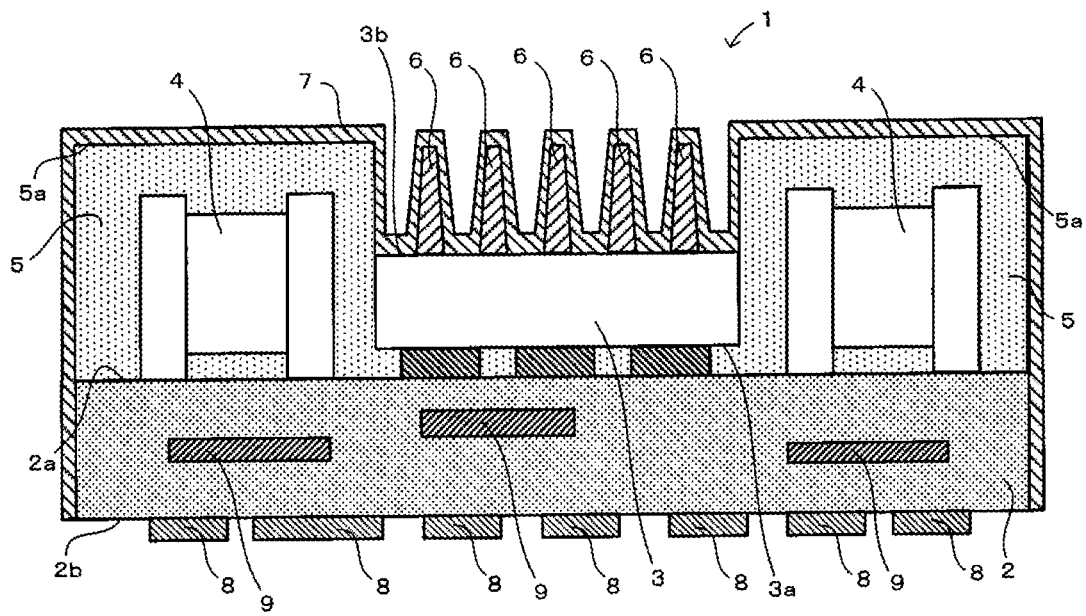
FIG. 1 is a sectional view of a module according to a first embodiment of the present disclosure.
Figure 2:
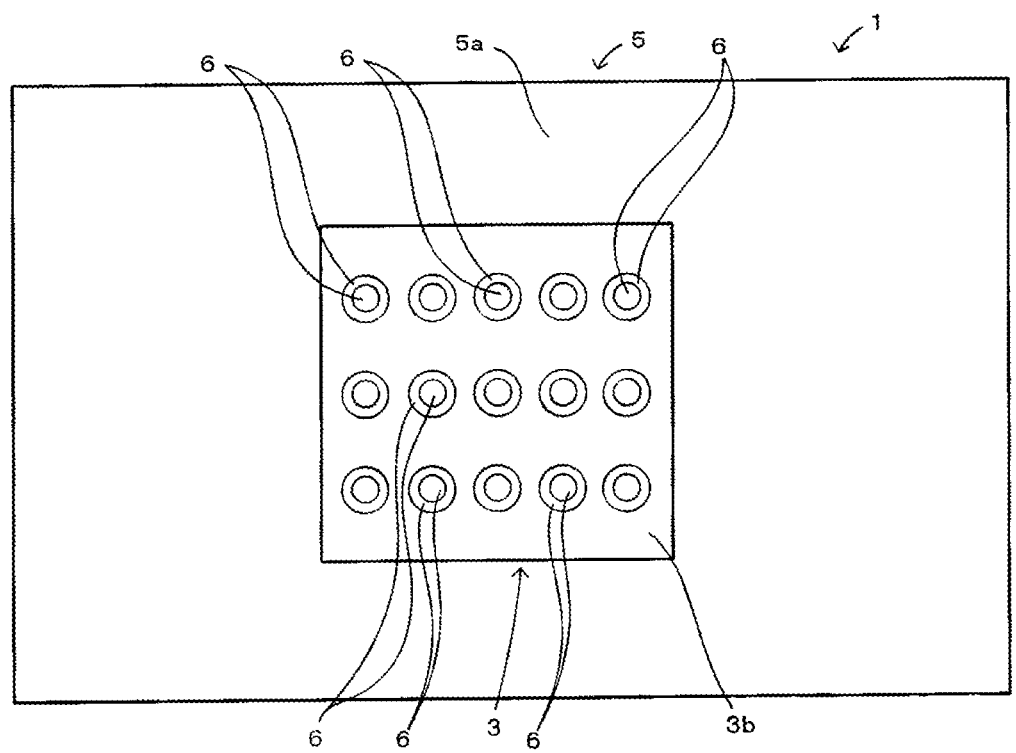
FIG. 2 is a plan view of the module in FIG. 1 before a shield is added.

A module 1 according to a first embodiment of the present disclosure will be described while referring to FIGS. 1 and 2. FIG. 1 is a sectional view of the module 1 according to the first embodiment and FIG. 2 is a plan view of the module 1 in FIG. 1 before a shield is added.

The module 1 according to the first embodiment is a module that is to be mounted on a mother substrate or the like of an electronic device that uses radio-frequency signals. The module 1 includes: a wiring substrate 2; a first component 3 and a plurality of second components 4 that are mounted on one main surface 2a of the wiring substrate 2; a sealing resin layer 5 that seals the first component 3, the second components 4, and so forth; heat-dissipating parts 6 that are arranged on a surface (hereafter referred to as "top surface") 3b of the first component 3 that is on the opposite side from a surface (surface of first component 3 on side that is mounted) 3a of the first component 3 that faces the one main surface 2a; a shield layer 7 that covers a surface of the sealing resin layer 5, part of the top surface 3b of the first component 3, and a surface of the heat-dissipating parts 6; and mounting electrodes 8.

The wiring substrate 2 is formed of a low-temperature co-fired ceramic, a glass epoxy resin, or the like. A plurality of land electrodes on which the first component 3 and the second components 4 are mounted are formed on the one main surface 2a of the wiring substrate 2, a plurality of mounting electrodes 8 are formed on another main surface 2b of the wiring substrate 2, and a plurality of ground electrodes, a plurality of types of wiring electrodes 9, and a plurality of via conductors are formed in or on surface layers and inner layers of the wiring substrate 2. Here, the ground electrodes are formed so as to be exposed from side surfaces of the wiring substrate 2, for example. In addition, the mounting electrodes 8 are constructed by forming solder bumps on outer electrodes on the other main surface 2b of the wiring substrate 2.

Furthermore, the land electrodes, the outer electrodes, the ground electrodes, and the wiring electrodes 9 are formed of a metal that is typically used for electrodes such as Cu, Ag, Al, or the like. In addition, the via conductors are formed of a metal such as Ag or Cu. Nickel and gold plating may be performed on the land electrodes and outer electrodes.

The first component 3 is a heat-generating component and possible examples of the first component 3 include a semiconductor element such as an IC or a power amplifier or a passive element such as a power inductor or a transformer. Furthermore, the second components 4 are components that substantially do not generate heat and possible examples of the second components 4 include inductors, capacitors, and filters.

The sealing resin layer 5 is provided so as to cover the one main surface 2a of the wiring substrate 2 and the first component 3 and the second components 4 mounted on the one main surface 2a except for the top surface 3b of the first component 3 and the sealing resin layer 5 does not cover the top surface 3b of the first component 3 and the heat-dissipating parts 6. In addition, an epoxy resin containing a general silica filler can be used as the sealing resin layer 5. An epoxy resin containing an alumina filler may also be used as the sealing resin layer 5 in order to give the sealing resin layer 5 high thermal conductivity.

The heat-dissipating parts 6 are arranged on the top surface 3b of the first component 3 and each of the heat-dissipating parts 6 has a substantially cylindrical shape. Furthermore, the highest position of each of the heat-dissipating part 6, relative to the one main surface 2a of the wiring substrate 2, is lower than the position of a highest surface 5a out of a surface of the sealing resin layer 5 that is on the opposite side from the surface of the sealing resin layer 5 that faces the one main surface 2a. In addition, after the shield layer 7 is formed, the height of the positions of the parts of the shield layer 7 that cover the highest parts of the heat-dissipating parts 6, relative to the one main surface 2a of the wiring substrate 2, is less than or equal to the height of the positions of the part of the shield layer 7 that covers the highest surface 5a of the sealing resin layer 5. Furthermore, the heat-dissipating parts 6 are formed of a material having high thermal conductivity such as various metals, a carbon material, and so forth. In the first embodiment, the highest surface 5a of the sealing resin layer 5 is disposed in parts other than the top surface 3b of the first component 3 so as so surround the entire periphery of the top surface 3b of the first component 3 in a plan view in a direction perpendicular to the top surface 3b of the first component 3.

In the first embodiment, fifteen heat-dissipating parts 6 are arranged in a three-by-five matrix pattern, but the arrangement pattern and number of heat-dissipating parts 6 are not limited to this example. Furthermore, the heat-dissipating parts 6 may have another columnar shape other than a substantially cylindrical shape such as a substantially rectangular parallelepiped shape.

The shield layer 7 is provided so as to cover the surface of the sealing resin layer 5 (the parts of the sealing resin layer 5 that are exposed before the shield is added), the parts of the top surface 3b of the first component 3 on which the heat-dissipating parts 6 are not arranged, the surfaces of the heat-dissipating parts 6 (the parts of the heat-dissipating parts 6 that are exposed before the shield is added), and the side surfaces of the wiring substrate 2. The shield layer 7 is for reducing unwanted electromagnetic waves radiated from external devices that reach the first component 3, the second components 4, the wiring electrodes, and so forth of the module 1 and for reducing leaking of unwanted electromagnetic waves radiated from the first component 3, the second components 4, the wiring electrodes, and so forth of the module 1 to the outside. In addition, the shielding effect can be increased as a result of the shield layer 7 contacting the ground electrodes that are exposed from the side surfaces of the wiring substrate 2.

The shield layer 7 can be formed so as to have a multilayer structure that includes an adhesive layer, a conductive layer that is stacked on the adhesive layer, and a corrosion resistant layer that is stacked on the conductive layer, for example. The adhesive layer is a layer that is provided in order to increase the strength of adhesion between the conductive layer, the sealing resin layer 5, and so on, and can for example be formed of a metal such as stainless steel. The conductive layer is a layer that realizes the substantial shielding function of the shield layer 7 and can be formed of any metal from among Cu, Ag, and Al, for example. The corrosion resistant layer is a layer that is provided in order to prevent corrosion of and damage to the conductive layer, and can be formed of stainless steel, for example.

(Method of Manufacturing Module)

Next, a method of manufacturing the module 1 will be described. In the first embodiment, the module 1 is manufactured by first forming an agglomeration of a plurality of modules 1 and then dividing the agglomeration into individual modules 1.

First, an agglomeration of wiring substrates 2 is prepared, in which for each wiring substrate 2, a plurality of land electrodes are formed on the one main surface 2a, a plurality of outer electrodes are formed on the other main surface 2b, and a plurality of ground electrodes, a plurality of types of wiring electrodes 9, a plurality of via conductors, and so forth are formed on or in surface layers and inner layers of the wiring substrate 2. The land electrodes, the outer electrodes, the ground electrodes, and the wiring electrodes 9 can be formed by performing screen printing using a conductive paste containing a metal such as Ag or Cu. Furthermore, the via conductors can be formed using a known method after forming via holes using a laser or the like.

Next, the first component 3 and the plurality of second components 4 are mounted on the one main surface 2a of each wiring substrate 2 using a known surface mount technology. For example, solder is applied by performing printing on desired land electrodes among the land electrodes of the wiring substrate 2, the first component 3 and the second components 4 are mounted by mounting the first component 3 and the second components 4 on the corresponding land electrodes among the land electrodes to which solder has been applied, and then a reflow process is performed. The agglomeration of wiring substrates 2 is washed as needed after the reflow process.

Next, the sealing resin layer 5 is formed on the one main surface 2a of each wiring substrate 2 so as to cover the one main surface 2a of the wiring substrate 2 and the first component 3 and the second components 4 mounted on the one main surface 2a. For example, a transfer molding method, a compression molding method, a liquid resin method, a sheet resin method, and so forth may be used when forming the sealing resin layer 5. Here, an epoxy resin containing a general silica filler can be used as the sealing resin layer 5. An epoxy resin containing an alumina filler may also be used as the sealing resin layer 5 in order to give the sealing resin layer 5 high thermal conductivity. Plasma washing is performed on the wiring substrate 2 as needed before forming the sealing resin layer 5. In addition, the sealing resin layer 5 is cured as necessary.

As needed, solder bumps are formed by applying solder to desired outer electrodes of the wiring substrate 2 using screen printing, mounting solder balls, and performing plating. Thus, the mounting electrodes 8 are formed.

Next, the top surface 3b of each first component 3 is exposed by removing resin from the part of the sealing resin layer 5 that covers the top surface 3b of the first component 3 using laser irradiation. Here, for example, a UV laser, a $CO_2$ laser, a green laser, and so forth can be used as the laser.

Next, a plurality of heat-dissipating parts 6 are formed on the top surface 3b of each first component 3. A high thermal conductivity material such as various metals, a carbon material, and so forth is used for the heat-dissipating parts 6. An example of the way in which the heat-dissipating parts 6 are formed is described hereafter.

An ink containing metal nanoparticles is ejected using an inkjet method onto desired places on the top surface 3b, each first component 3 and the ink is stacked up by ejecting the ink two or more times. The ink containing the metal nanoparticles is sintered by performing firing after ejection of the ink is complete and the ink is cured to form the heat-dissipating parts 6 having a substantially cylindrical shape. Here, the ink is ejected a number of times such that the height of the highest position of each heat-dissipating part 6 after curing relative to the one main surface 2a of the wiring substrate 2 is less than or equal to the height of the position of the highest surface 5a of the sealing resin layer 5.

Furthermore, the particle diameter of the metal nanoparticles contained in the ink can be smaller than 500 nm. This is because in the case where the metal nanoparticles are larger than 500 nm, the firing temperature becomes higher and the reliability of the first component 3 and so on mounted on the one main surface 2a of the wiring substrate 2 is reduced.

Furthermore, at least one metal selected from a transition metal group can contain Cu, Ni, Co, Ag, Pd, Rh, Ru, Au, Pt, Ir, and so forth be used as the material of the metal nanoparticles. In addition, the selected metal may be used as it is, may be used in the form of an alloy, or may be used in the form of an oxide of that metal.

The ink can have a viscosity such that a substantially ellipsoidal shape is formed when ink ejection is performed one time. By making the viscosity of the ink high, the ejected ink becomes less likely to spread in a wet manner and the shape of a liquid ball remains in a substantially ellipsoidal shape every time ink is ejected, and therefore the heat-dissipating parts 6 have substantially cylindrical shapes in which parts having a large width and parts having a small width alternate. In addition, assuming that the ejected ink spreads evenly, the shape of a cross section (plane parallel to top surface 3b of the first component 3) of each heat-dissipating part 6 can be substantially circular and that the diameter of thereof be in a range from 50 to 300 μm. This is because there is a possibility of cracks occurring in the heat-dissipating parts 6 due to the occurrence of shrinkage during curing if the diameter of the heat-dissipating parts 6 is too small. On the other hand, the number of heat-dissipating parts 6 that can be formed on the top surface 3b of the first component 3 is reduced and the total surface area of the plurality of heat-dissipating parts 6 that can be arranged on the top surface 3b of the first component 3 is reduced when the diameter is too large.

The firing is performed in an oxidizing atmosphere or a reducing atmosphere depending on the metal nanoparticles and dispersing agent contained in the ink. For example, the firing can be performed in an oxidizing atmosphere in order to quickly remove the dispersing agent and the firing can be performed in a reducing atmosphere in the case where an oxide is included in the metal nanoparticles. Whether firing is performed in an oxidizing atmosphere or a reducing atmosphere can be controlled by changing the type of gas that is introduced. For example, in the case where firing is performed in an oxidizing atmosphere, air, an oxidizing gas, or the like may be introduced, and in the case where firing is performed in a reducing atmosphere, hydrogen gas or the like may be introduced.

Once the heat-dissipating parts 6 have been formed on the top surface 3b of each first component 3, the individual modules 1 are obtained using a dicer or by performing laser processing.

Next, the shield layer 7 is formed so as to cover the surface of the sealing resin layer 5, the parts of the top surface 3b of the first component 3 where the heat-dissipating parts 6 are not arranged, the surfaces of the heat-dissipating parts 6, and the side surfaces of the wiring substrate 2. For example, a sputtering method, a vapor deposition method, a paste coating method, and so on may be used when forming the shield layer 7. The shield layer 7 may be connected to ground electrodes of the wiring substrate 2.

In addition, as necessary, the module 1 may be subjected to washing, printing, measurement, external inspection, packaging, and shipping.

According to the first embodiment described above, as a result of arranging the heat-dissipating parts 6 on the top surface 3b of the first component 3, the surface area of the part that contributes to dissipation of heat is increased, and therefore the heat-dissipating effect is improved. In addition, since the surface of the sealing resin layer 5, parts of the top surface 3b of the first component 3, and the surfaces of the heat-dissipating parts 6 are covered by the shield layer 7, the surface area of the part that contributes to dissipation of heat is further increased, and therefore the heat-dissipating effect is further improved. Furthermore, heat emitted from the first component 3 can be released to the heat-dissipating parts 6, the shield layer 7, the ground electrodes that are connected to the shield layer 7, and to a mother substrate or the like via the mounting electrodes 8 that are connected to the ground electrodes and are formed on the other main surface 2b of the module 1. In addition, since the module 1 has an excellent heat-dissipating effect, the size of the load current of the first component 3 can be increased.

Figure 3:
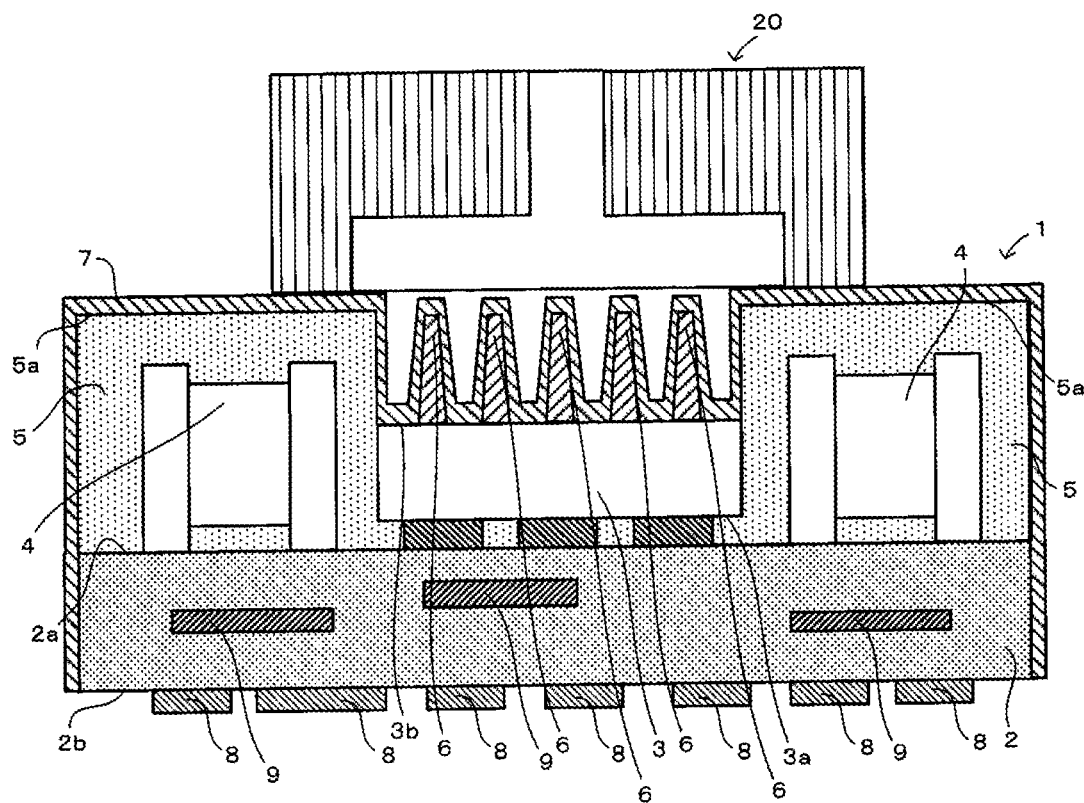
FIG. 3 is a diagram illustrating the positional relationship between the module in FIG. 1 and a suction pad.

Furthermore, the height of the highest position of the heat-dissipating parts 6 relative to the one main surface 2a of the wiring substrate 2 is made to be less than or equal to the height of the position of the highest surface 5a of the sealing resin layer 5, and consequently the heat-dissipating parts 6 do not protrude beyond the highest surface 5a of the sealing resin layer 5, i.e., the parts of the shield layer 7 that cover the highest parts of the heat-dissipating parts 6 do not protrude beyond the part of the shield layer 7 that covers the highest surface 5a of the sealing resin layer 5. Therefore, when mounting the module 1 on a mother substrate or the like using a suction pad 20, as illustrated in FIG. 3, the module 1 can be stably mounted on a mother substrate or the like without necessarily the heat-dissipating parts 6 interfering with the suction pad 20. In addition, since the highest surface 5a of the sealing resin layer 5 is disposed so as to surround the entire periphery of the top surface 3b of the first component 3 in a plan view in a direction perpendicular to the top surface 3b of the first component 3, the occurrence of leaks when suction is applied by the suction pad 20 can be prevented.

Furthermore, as a result of using a material having a high thermal conductivity such as various metals, a carbon material, or the like as the material of the heat-dissipating parts 6, heat emitted by the first component 3 is rapidly transmitted to the entirety of each heat-dissipating part 6, and therefore the heat-dissipating effect is further improved.

<Modification 1>

Figure 4:
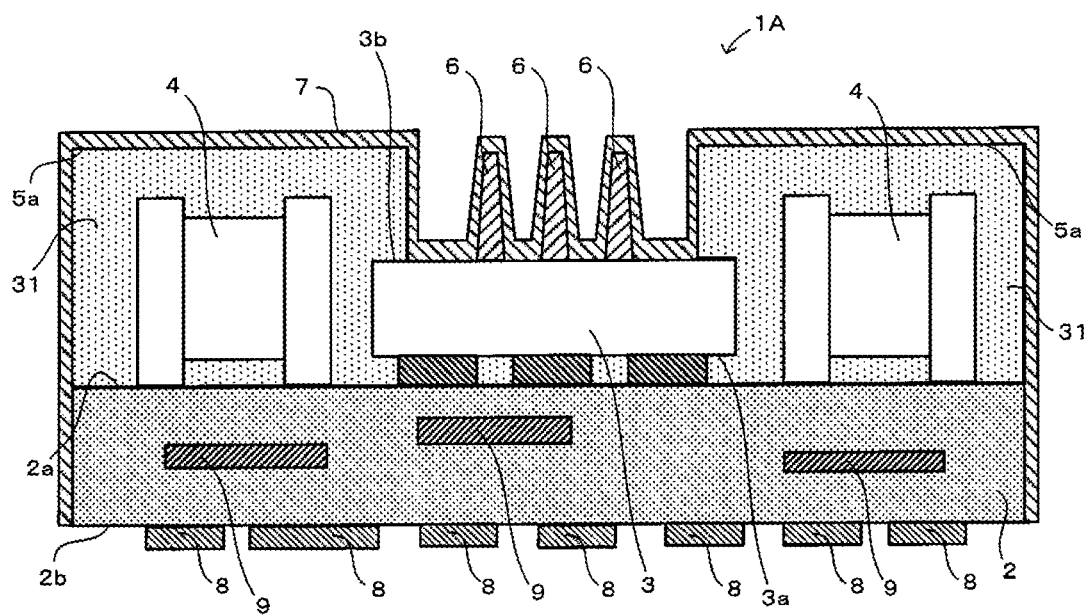
FIG. 4 is a sectional view of a module according to modification 1 of the first embodiment of the present disclosure.

Modification 1 of the module 1 according to the first embodiment of the present disclosure will be described while referring to FIG. 4. FIG. 4 is a sectional view of a module 1A according to modification 1.

In the module 1A according to modification 1, a sealing resin layer 31 is provided so as to not cover a region of the top surface 3b of the first component 3 that includes a part that reaches a high temperature and so as to cover the remaining region of the top surface 3b of the first component 3. Here, the part of the top surface 3b of the first component 3 that reaches a high temperature is a part where a power source block and a power amplifier block of the first component 3 are present, for example, in a plan view in a direction perpendicular to the top surface 3b.

In the module 1A, the heat-dissipating parts 6 are arranged in a region of the top surface 3b of the first component 3 that includes the part that reaches a high temperature. As a result, heat emitted from the first component 3 is rapidly conducted to the heat-dissipating parts 6, and therefore the module 1A can efficiently dissipate heat.

<Modification 2>

Figure 5:
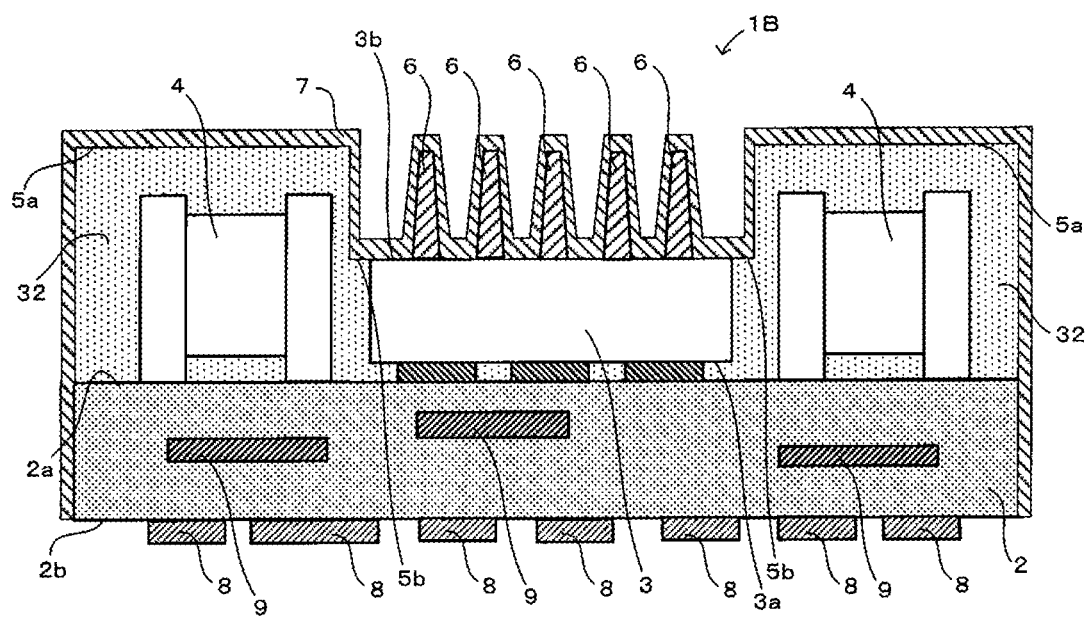
FIG. 5 is a sectional view of a module according to modification 2 of the first embodiment of the present disclosure.

Modification 2 of the module 1 according to the first embodiment of the present disclosure will be described while referring to FIG. 5. FIG. 5 is a sectional view of a module 1B according to modification 2.

In the module 1B of modification 2, a sealing resin layer 32 is formed by removing the resin from the top surface 3b of the first component 3 and from a peripheral part that is peripheral to the top surface 3b in a plan view in a direction perpendicular to the top surface 3b of the first component 3. In other words, the height of the position of a surface 5b of the peripheral part of the sealing resin layer 32 that is peripheral to the first component 3 is substantially the same as the height of the position of the top surface 3b of the first component 3 with respect to the one main surface 2a of the wiring substrate 2.

In the module 1B, a distance from the surface of the shield layer 7 that is on the first component 3 side to a side surface of the shield layer 7 that is on the outer side is small, and therefore the module 1B can realize efficient dissipation of heat.

<Modification 3>

Figure 6A:
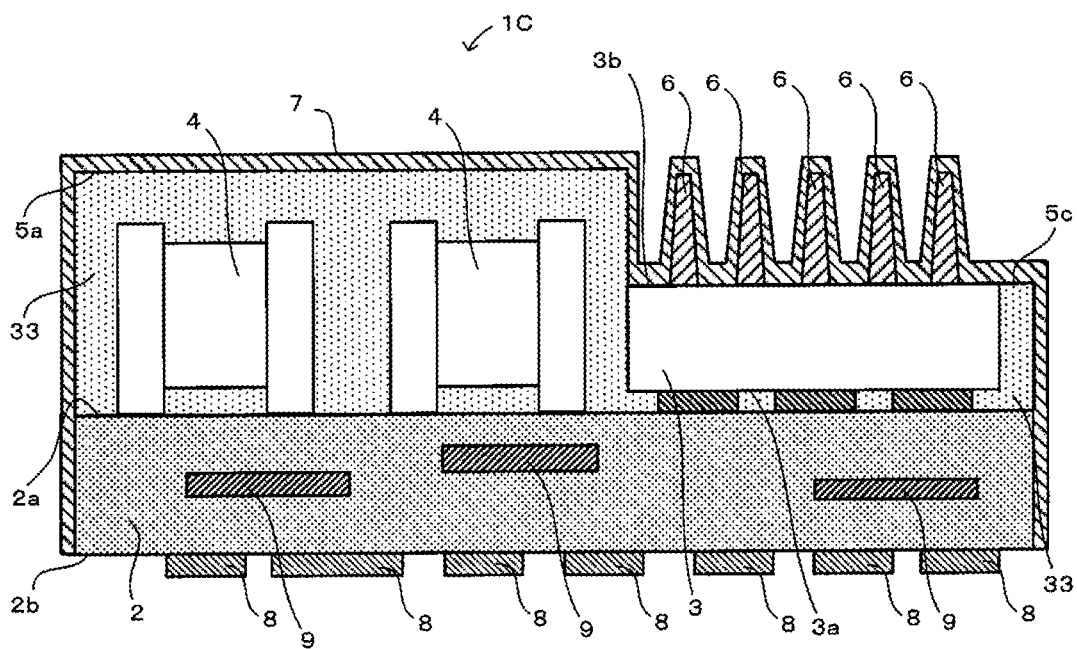
FIG. 6A is a sectional view of a module according to modification 3 of the first embodiment of the present disclosure and FIG. 6B is a plan view of the module in FIG. 6A before a shield is added.
Figure 6B:
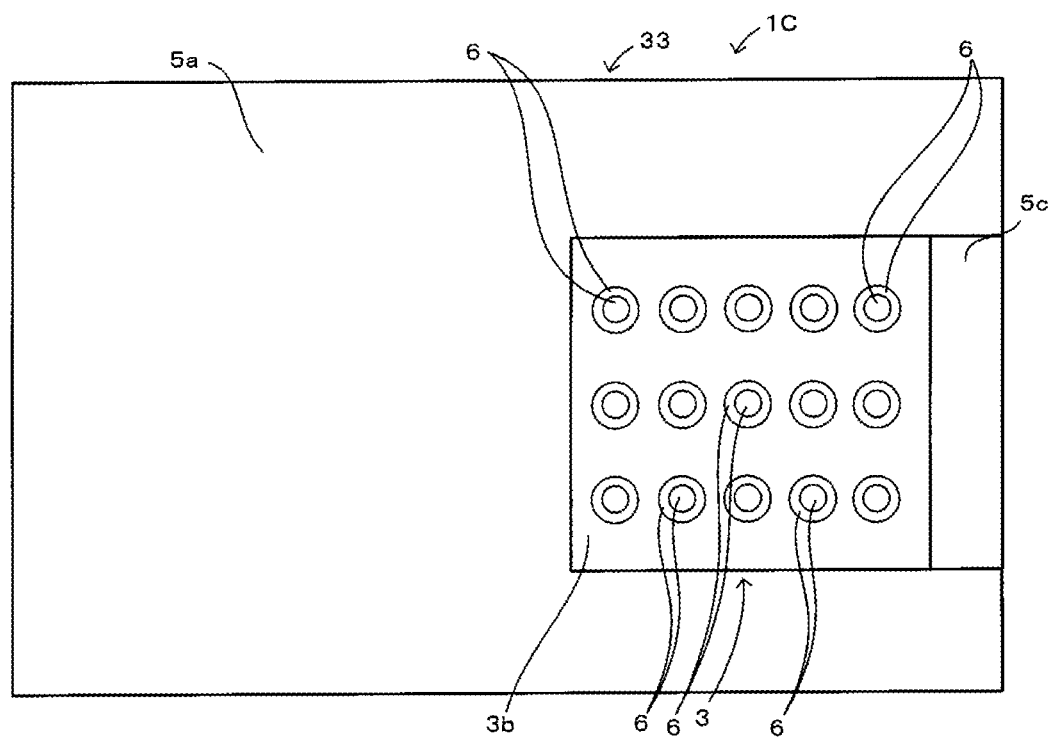

Modification 3 of the module 1 according to the first embodiment of the present disclosure will be described while referring to FIGS. 6A and 6B. FIG. 6A is a sectional view of a module 1C according to modification 3 and FIG. 6B is a plan view of the module 1C in FIG. 6A before a shield is added. The term "right" used in modification 3 indicates "right" on the module 1C in the plan view (plane of FIG. 6B) in a direction perpendicular to the top surface of the module 1C.

In the module 1C of modification 3, the first component 3 is arranged in the vicinity of an end portion of the one main surface 2a of the wiring substrate 2 at the center in a plan view in a direction perpendicular to the one main surface 2a of the wiring substrate 2. In more detail, the first component 3 is arranged on a part of the one main surface 2a of the wiring substrate 2 that is close to a prescribed side of the one main surface 2a ("right side of one main surface 2a" in modification 3) and that is not close to (or distant equally from or unequally from) two sides that are connected to the prescribed side ("upper side of one main surface 2a" and "lower side of one main surface 2a" in modification 3). In addition, in the module 1C, a sealing resin layer 33 is formed by removing the resin from the top surface 3b of the first component 3 and from a right peripheral part out of a peripheral part that is peripheral to the top surface 3b in a plan view in a direction perpendicular to the top surface 3b of the first component 3. In more detail, the sealing resin layer 33 is formed by removing the resin from the top surface 3b of the first component 3 and by removing the resin from a first part located between the prescribed side of the one main surface 2a and a side of the top surface 3b that faces the prescribed side ("right peripheral part out of peripheral part that is peripheral to top surface 3b" in modification 3) such that a surface of the sealing resin layer 33 in the first part becomes substantially flush with the top surface 3b. In other words, the height of the position of a surface 5c of the right peripheral part of the peripheral part of the sealing resin layer 33 that is peripheral to the first component 3 is substantially the same as the height of the position of the top surface 3b of the first component 3 with respect to the one main surface 2a of the wiring substrate 2. In more detail, the height of the position of the surface of the first part of the sealing resin layer 33 that is on the opposite side from the surface that faces the one main surface 2a is substantially the same as the height of the position of the top surface 3b of the first component 3. In modification 3, the highest surface 5a of the sealing resin layer 33 is disposed so as to surround the periphery of the top surface 3b of the first component 3 except for at the right side of the periphery of the top surface 3b of the first component 3 in a plan view in a direction perpendicular to the top surface 3b of the first component 3. In more detail, the highest surface 5a of the sealing resin layer 33 is disposed so as to surround the periphery of the top surface 3b of the first component 3 except for at the side of the top surface 3b that faces the prescribed side ("right side of top surface 3b of first component 3" in modification 3). Therefore, when the module 1C is mounted on a mother substrate or the like, the heat-dissipating parts 6 allow the module 1C to be stably mounted on the mother substrate or the like with certainty with the use of a suction pad. In addition, since the shield layer 7 is close to the ground electrodes to which the shield layer 7 is connected, a heat dissipation path can be made short. Therefore, the heat-dissipating effect is further improved.

<Modification 4>

Figure 7:
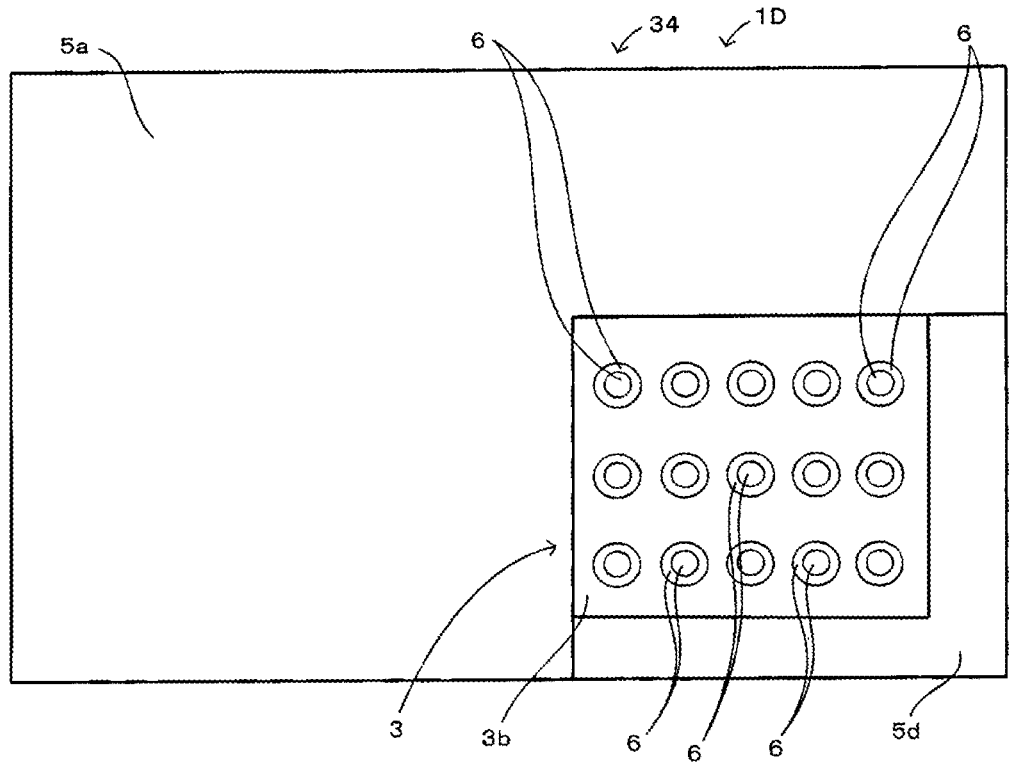
FIG. 7 is a plan view of a module according to modification 4 of the first embodiment of the present disclosure before a shield is added.

Modification 4 of the module 1 according to the first embodiment of the present disclosure will be described while referring to FIG. 7. FIG. 7 is a plan view of a module 1D according to modification 4 before a shield is added. The terms "left", "right", "up", and "down" used in modification 4 indicate "left", "right", "up", and "down" in a plan view (plane of FIG. 7) in a direction perpendicular to the top surface of the module 1D.

In the module 1D of modification 4, the first component 3 is arranged in the vicinity of an end portion of the one main surface 2a of the wiring substrate 2 at the lower right in a plan view in a direction perpendicular to the one main surface 2a of the wiring substrate 2. In more detail, the first component 3 is arranged on a part of the one main surface 2a of the wiring substrate 2 that is close to a prescribed side of the one main surface 2a ("right side of one main surface 2a" in modification 4), is close to one side among the two sides of the one main surface 2a that are connected to the prescribed side ("lower side of one main surface 2a" in modification 4), and that is not close to the other side among the two sides that are connected to the prescribed side ("upper side of one main surface 2a" in modification 4). Furthermore, in the module 1D, a sealing resin layer 34 is formed by removing the resin from the top surface 3b of the first component 3 and from a right peripheral part and a lower peripheral part out of a peripheral part that is peripheral to the top surface 3b in a plan view in a direction perpendicular to the top surface 3b of the first component 3. In more detail, the sealing resin layer 34 is formed by removing the resin from the top surface 3b of the first component 3 and by removing the resin from a first part located between the prescribed side of the one main surface 2a and a side of the top surface 3b that faces the prescribed side, from a second part located between the one side of the one main surface 2a and a side of the top surface 3b that faces the one side, and a third part located between a side of the first part that faces the one side of the one main surface 2a and the one side ("the right peripheral part and the lower peripheral part out of the peripheral part that is peripheral to top surface 3b" correspond to the first part, the second part, and the third part in modification 4) such that the surface of the sealing resin layer 34 in the first part, the second part, and the third part is substantially flush with the top surface 3b. In other words, the height of the position of a surface 5d of a peripheral part that encompasses the right peripheral part and the lower peripheral part out of the peripheral part of the sealing resin layer 34 that is peripheral to the first component 3 is substantially the same as the height of the position of the top surface 3b of the first component 3 with respect to the one main surface 2a of the wiring substrate 2. In more detail, the heights of the positions of the surfaces of the first part, the second part, and the third part of the sealing resin layer 34 that are on the opposite side from the surface of the sealing resin layer 34 that faces the one main surface 2a are substantially the same as the height of the position of the top surface 3b of the first component 3. In modification 4, the highest surface 5a of the sealing resin layer 34 is disposed so as to surround the periphery at the left side and the upper side out of the periphery of the top surface 3b of the first component 3 in a plan view in a direction perpendicular to the top surface 3b of the first component 3. In more detail, the highest surface 5a of the sealing resin layer 34 is disposed so as to surround a side of the periphery of the top surface 3b of the first component 3 that is on the opposite side from the side of the periphery that corresponds to the prescribed side (corresponds to "left side of top surface 3b of first component 3" in modification 4) and the side of the periphery that is on the opposite side from the side of the periphery corresponding to the one side (corresponds to "upper side of top surface 3b of first component 3" in modification 4). Therefore, when the module 1D is mounted on a mother substrate or the like, the heat-dissipating parts 6 allow the module 1D to be stably mounted on the mother substrate or the like with certainty with the use of a suction pad. In addition, In addition, since the shield layer 7 is close to the ground electrodes to which the shield layer 7 is connected, a heat dissipation path can be made short. Therefore, the heat-dissipating effect is further improved.

Second Embodiment

Figure 8:
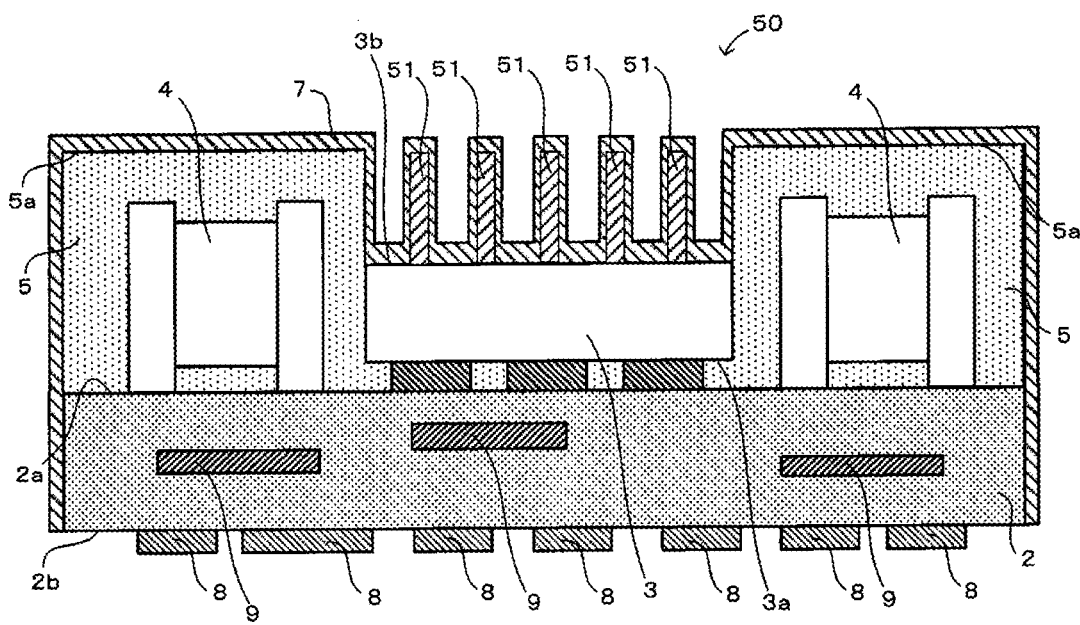
FIG. 8 is a sectional view of a module according to a second embodiment of the present disclosure.

A module 50 according to a second embodiment of the present disclosure will be described while referring to FIGS. 8 and 9. FIG. 8 is a sectional view of the module 50 according to the second embodiment and FIG. 9 is a plan view of the module 50 in FIG. 8 before a shield is added.

Figure 9:
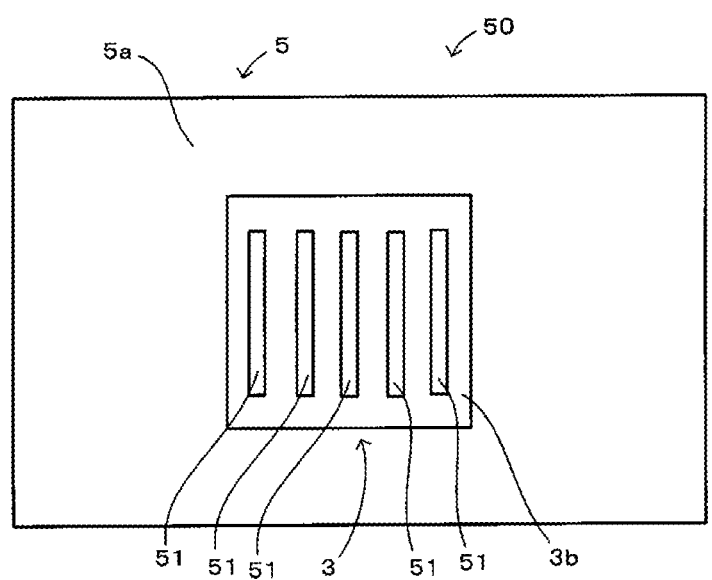
FIG. 9 is a plan view of the module in FIG. 8 before a shield is added.

The module 50 according to the second embodiment differs from the module 1 according to the first embodiment described using FIGS. 1 and 2 in that heat-dissipating parts 51, each has a plate-like shape rather than a columnar shape as illustrated in FIGS. 8 and 9. The rest of the configuration is the same as in the module 1 according to the first embodiment, and therefore the same reference symbols are used and description thereof is omitted.

The heat-dissipating parts 51 are arranged on the top surface 3b of the first component 3 and each has a substantially plate-like shape. Furthermore, relative to the one main surface 2a of the wiring substrate 2, the highest position of each heat-dissipating part 51 is lower than the position of the highest surface 5a out of a surface of the sealing resin layer 5 that is on the opposite side from the surface of the sealing resin layer 5 that faces the one main surface 2a. In addition, after the shield layer 7 is formed, relative to the one main surface 2a of the wiring substrate 2 as a reference, the height of the positions of the parts of the shield layer 7 that cover the highest parts of the heat-dissipating parts 51 is less than or equal to the height of the positions of the part of the shield layer 7 that covers the highest surface 5a of the sealing resin layer 5. Furthermore, the heat-dissipating parts 51 are formed of a material having high thermal conductivity such as various metals, a carbon material, and so forth. In the second embodiment, the highest surface 5a of the sealing resin layer 5 is disposed in parts other than the top surface 3b of the first component 3 so as so surround the entire periphery of the top surface 3b of the first component 3 in a plan view in a direction perpendicular to the top surface 3b of the first component 3.

In the second embodiment, five heat-dissipating parts 51 are arranged in a line, but the arrangement pattern and number of heat-dissipating parts 51 are not limited to this example.

(Method of Manufacturing Module)

Next, a method of manufacturing the module 50 will be described. In the second embodiment, the module 50 is manufactured by first forming an agglomeration of a plurality of modules 50 and then dividing the agglomeration into individual modules 50.

Steps from the step of preparing an agglomeration of wiring substrates 2 up to the step of removing the part of the sealing resin layer 5 that covers the top surface 3b of the first component 3 are performed in the same manner as in the method of manufacturing the module 1 according to the first embodiment.

Next, the plurality of heat-dissipating parts 51 are formed on the top surface 3b of each first component 3. A high thermal conductivity material such as various metals, a carbon material, and so forth is used for the heat-dissipating parts 51. An example of the way in which the heat-dissipating parts 51 are formed is described hereafter.

A thermally curable adhesive is applied to desired locations on the top surface 3b of first component 3. Thermal conductivity can be improved by using an adhesive containing a metal filler as the thermally curable adhesive.

After applying the thermally curable adhesive, metal plates are mounted on the applied thermally curable adhesive as the heat-dissipating parts 51. In the state where the heat-dissipating parts 51 composed of metal plates have been mounted on the adhesive, the height of the highest position of each heat-dissipating part 51 relative to the one main surface 2a of the wiring substrate 2 is less than or equal to the height of the position of the highest surface 5a of the sealing resin layer 5. Cu, Al, stainless steel, brass, or the like can be used as the material of the metal plates.

The steps from the step of dividing the agglomeration into individual modules 50 are performed in the same manner as in the method of manufacturing the module 1 according to the first embodiment.

The same effect is obtained with the module 50 according to the second embodiment described above as with the module 1 according to the first embodiment.

<Modification 1>

Figure 10A:
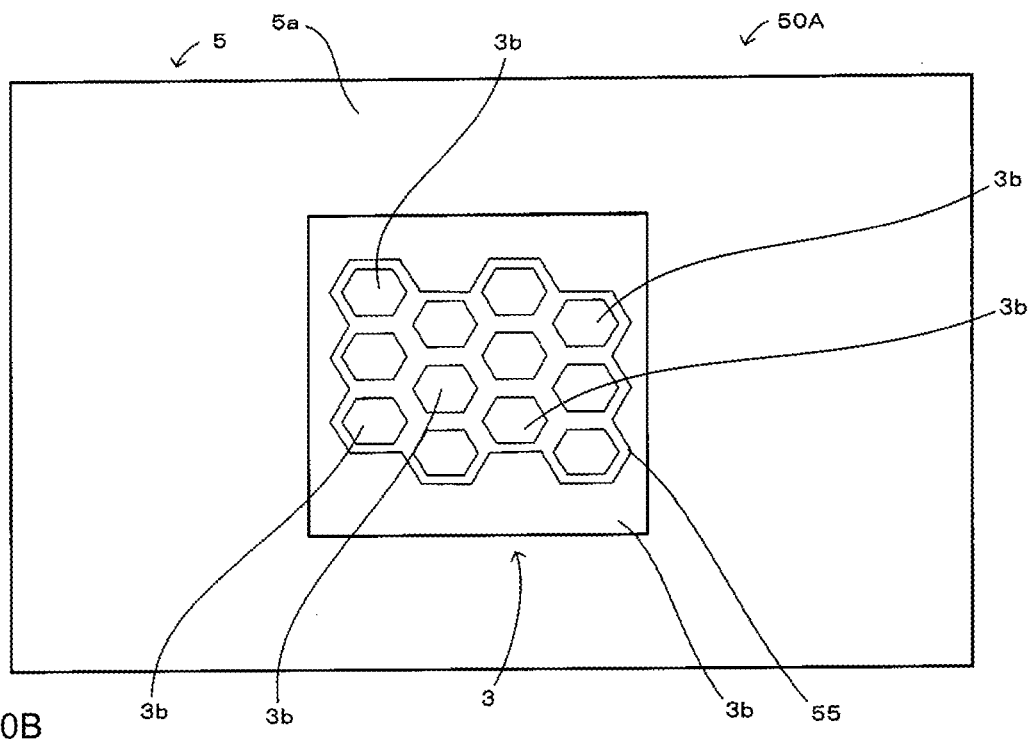
FIG. 10A is a plan view of a module according to modification 1 of the second embodiment of the present disclosure before a shield is added and FIG. 10B is a plan view of a module according to modification 2 of the second embodiment of the present disclosure before a shield is added.

Modification 1 of the module 50 according to the second embodiment of the present disclosure will be described while referring to FIG. 10A. FIG. 10A is a plan view of a module 50A according to modification 1 before a shield is added. In the module 50A according to modification 1, a heat-dissipating part 55 that is arranged on the top surface 3b of the first component 3 has a honeycomb structure.

<Modification 2>

Figure 10B:
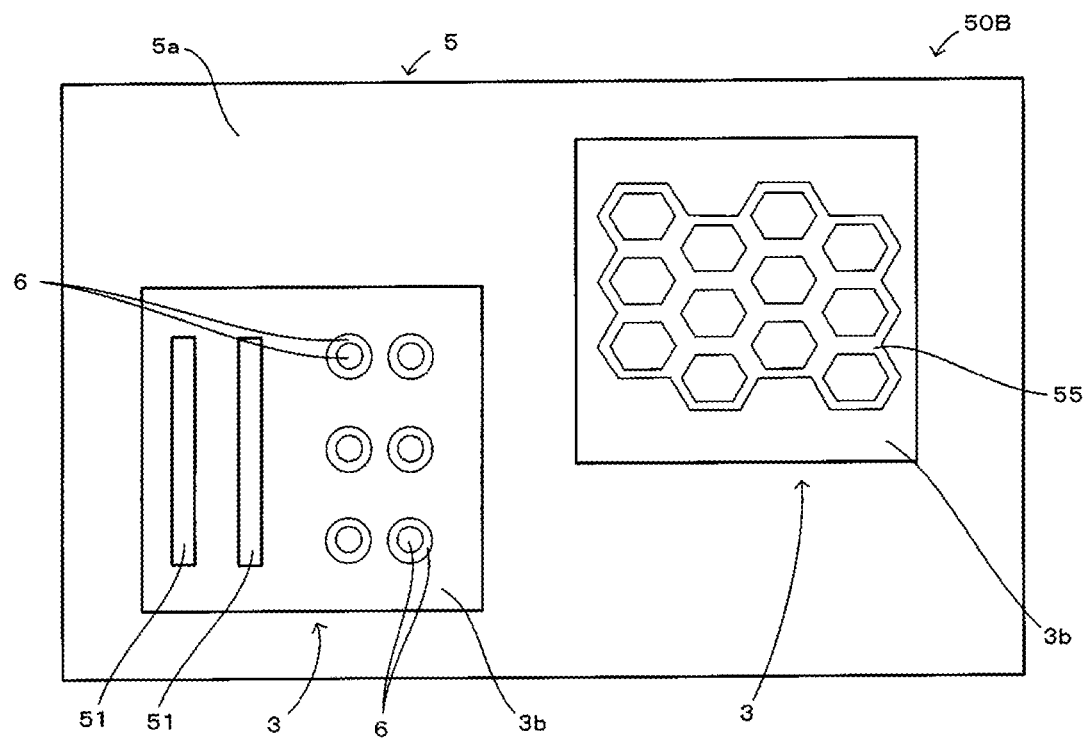
Figure 11A:
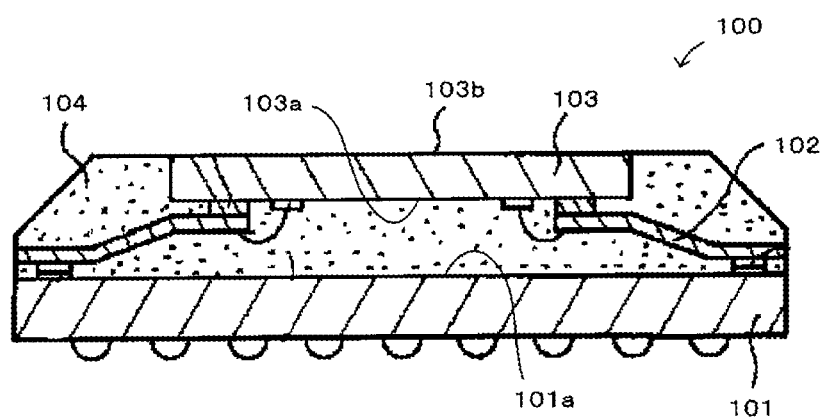
FIG. 11A is an example of a sectional view of a module of the related art and FIG. 11B is another example of a sectional view of a module of the related art.
Figure 11B:
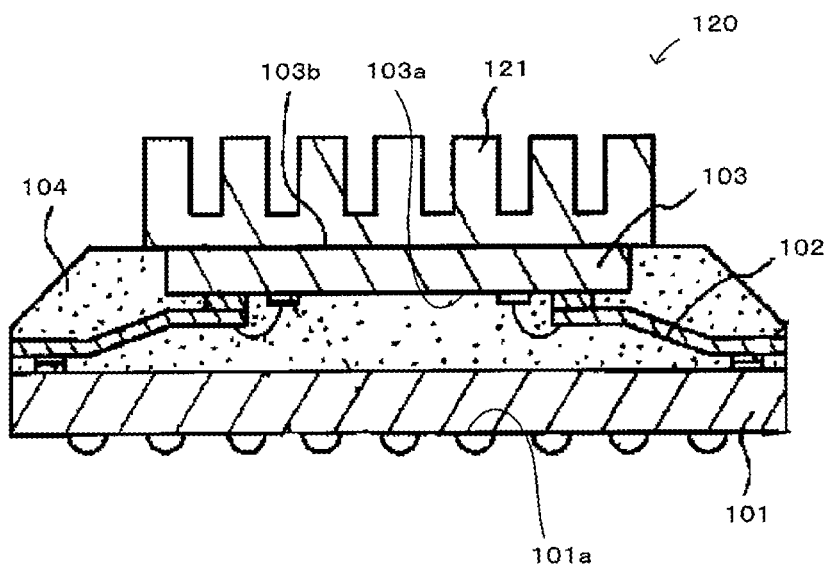

Modification 2 of the module 50 according to the second embodiment of the present disclosure will be described while referring to FIG. 10B. FIG. 10B is a plan view of a module 50B according to modification 2 before a shield is added.

In the module 50B according to modification 2, a plurality of first components 3 and a plurality of second components 4 are mounted on the one main surface 2a of the wiring substrate 2. Similarly to as in the module 1 according to the first embodiment, the top surface 3b of each first component 3 is not covered by the sealing resin layer 5. Columnar heat-dissipating parts 6 and plate-shaped heat-dissipating parts 51 are arranged in a mixed manner on the top surface 3b of one first component 3 among the plurality of first components 3. In addition, a heat-dissipating part 55 having a honeycomb structure is arranged on the top surface 3b of the other first component 3 among the plurality of first components 3. The highest surface 5a of the sealing resin layer 5 is disposed in parts other than the top surfaces 3b of the first components 3 so as to surround the peripheries of the top surfaces 3b of the first components 3 in a plan view in a direction perpendicular to the top surface 3b of each first component 3.

The plate-shaped heat-dissipating parts 51 and the heat-dissipating part 55 having a honeycomb structure can be formed using a method in which ink is ejected using an ink jet method as described in the first embodiment. Furthermore, the columnar heat-dissipating parts 6 can be formed by applying a thermally curable adhesive to desired locations on the top surface 3b of the first component 3 and then mounting column-shaped rods on the adhesive, similarly to the heat-dissipating parts 51 in the second embodiment.

The present disclosure is not limited to the above-described embodiments and can be modified in various ways not described above so long as they do not depart from the gist of the disclosure. For example, the content of the embodiments and the content of the modifications described above may be combined with each other.

INDUSTRIAL APPLICABILITY

The present disclosure can be applied to a module in which a heat-generating component is mounted on a wiring substrate and that includes a heat-dissipating structure.

REFERENCE SIGNS LIST 1, 1A, 1B, 1C, 1D, 50, 50A, 50B module
2 wiring substrate
3 first component
4 second component
5, 31, 32, 33, 34 sealing resin layer
6, 51, 55 heat-dissipating part
7 shield layer

The invention claimed is:

1. A module comprising:
a wiring substrate;
a first component that is mounted on one main surface of the wiring substrate and generates heat;
a second component that is mounted on the one main surface;
a sealing resin layer that seals the first component and the second component without covering at least part of an opposite surface of the first component that is opposite from a surface of the first component mounted on the one main surface of the wiring substrate; and
a heat-dissipating part that is arranged on the at least part of the opposite surface of the first component;
wherein a height of a highest position of the heat-dissipating part relative to the one main surface is less than or equal to a height of a highest position of the sealing resin layer when viewed in a direction perpendicular to the one main surface of the wiring substrate, and
wherein the heat-dissipating part has a columnar structure not parallel to the one main surface of the wiring substrate or a plate-shaped structure not parallel to the one main surface of the wiring substrate.

2. The module according to claim 1, wherein a material of the heat-dissipating part is a metal.

3. The module according to claim 1, further comprising:
a shield layer that covers the surface of the sealing resin layer, a part of the at least part of the opposite surface of the first component on which the heat-dissipating part is not arranged, a surface of the heat-dissipating part, and a side surface of the wiring substrate.

4. The module according to claim 2, further comprising:
a shield layer that covers the surface of the sealing resin layer, a part of the at least part of the opposite surface of the first component on which the heat-dissipating part is not arranged, a surface of the heat-dissipating part, and a side surface of the wiring substrate.

5. The module according to claim 1, wherein the heat-dissipating part has a honeycomb structure.

6. The module according to claim 2, wherein the heat-dissipating part has a honeycomb structure.

7. The module according to claim 3, wherein the heat-dissipating part has a honeycomb structure.

8. The module according to claim 1, wherein the heat-dissipating part has a plurality of the columnar structures, independently and separately, arranged on the at least part of the opposite surface of the first component, and the plurality of the columnar structures is spaced apart with each other in a direction parallel to the one main surface of the wiring substrate.

9. The module according to claim 1, wherein the heat-dissipating part has a plurality of the plate-shaped structures, independently and separately, arranged on the at least part of the opposite surface of the first component, and the plurality of the plate-shaped structures is spaced apart with each other in a direction parallel to the one main surface of the wiring substrate.

10. A module comprising:
a wiring substrate;
a first component that is mounted on one main surface of the wiring substrate and generates heat;
a second component that is mounted on the one main surface;
a sealing resin layer that seals the first component and the second component without covering at least part of an opposite surface of the first component that is opposite from a surface of the first component mounted on the one main surface of the wiring substrate;
a heat-dissipating part that is arranged on the at least part of the opposite surface of the first component; and
a shield layer that covers the surface of the sealing resin layer, a part of the at least part of the opposite surface of the first component on which the heat-dissipating part is not arranged, a surface of the heat-dissipating part, and a side surface of the wiring substrate,
wherein a height of a highest position of the heat-dissipating part relative to the one main surface is less than or equal to a height of a highest position of the sealing resin layer when viewed in a direction perpendicular to the one main surface of the wiring substrate.

11. A module comprising:
a wiring substrate;
a first component that is mounted on one main surface of the wiring substrate and generates heat;
a second component that is mounted on the one main surface;
a sealing resin layer that seals the first component and the second component without covering at least part of an opposite surface of the first component that is opposite from a surface of the first component mounted on the one main surface of the wiring substrate;
a heat-dissipating part that is arranged on the at least part of the opposite surface of the first component; and
a shield layer that covers the surface of the sealing resin layer, a part of the at least part of the opposite surface of the first component on which the heat-dissipating part is not arranged, a surface of the heat-dissipating part, and a side surface of the wiring substrate,
wherein a height of a highest position of the heat-dissipating part relative to the one main surface is less than or equal to a height of a highest position of the sealing resin layer when viewed in a direction perpendicular to the one main surface of the wiring substrate, and
wherein a material of the heat-dissipating part is a metal.

* * * * *